(12) United States Patent
Chen (10) Patent No.: US 11,456,223 B2
(45) Date of Patent: Sep. 27, 2022

(54) SEMICONDUCTOR STRESS MONITORING STRUCTURE AND SEMICONDUCTOR CHIP

(71) Applicant: TAIWAN SEMICONDUCTOR MANUFACTURING COMPANY LTD., Hsinchu (TW)

(72) Inventor: Chien-Mao Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1 day.

(21) Appl. No.: 17/070,237

(22) Filed: Oct. 14, 2020

(65) Prior Publication Data

US 2022/0115277 A1   Apr. 14, 2022

(51) Int. Cl.
*H01L 21/66* (2006.01)
*H01L 23/528* (2006.01)
*H01L 23/522* (2006.01)

(52) U.S. Cl.
CPC .......... *H01L 22/32* (2013.01); *H01L 23/528* (2013.01); *H01L 23/5226* (2013.01)

(58) Field of Classification Search
CPC .... H01L 22/32; H01L 23/5226; H01L 23/528
USPC .......................................................... 257/48
See application file for complete search history.

(56) References Cited

U.S. PATENT DOCUMENTS

| | | | |
|---|---|---|---|
| 8,987,922 B2 | 3/2015 | Yu et al. | |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,372,206 B2 | 6/2016 | Wu et al. | |
| 9,496,189 B2 | 11/2016 | Yu et al. | |
| 11,038,067 B2 * | 6/2021 | Hiblot | H01L 29/43 |
| 2020/0152804 A1 * | 5/2020 | Hiblot | H01L 29/78696 |

* cited by examiner

*Primary Examiner* — Tu-Tu V Ho
(74) *Attorney, Agent, or Firm* — WPAT, P.C., Intellectual Property Attorneys; Anthony King (57) ABSTRACT

Present disclosure provides a semiconductor stress monitoring structure, including a substrate, first conductive segments, second conductive segments, and a sensing structure. The first conductive segments are over the substrate and arranged parallel to each other. The second conductive segments are arranged below the first conductive segments and parallel to each other. The sensing structure is proximate to the substrate. The sensing structure is configured to respond to a stress caused by the first conductive segments and the second conductive segments and generate a monitoring signal.

20 Claims, 11 Drawing Sheets

FIG. 11

SEMICONDUCTOR STRESS MONITORING STRUCTURE AND SEMICONDUCTOR CHIP

BACKGROUND

The semiconductor industry has experienced rapid growth, and the semiconductor structure has become more and more complicated. When the dimension of the semiconductor elements continuous to shrink, the number of the element and the number of the layer stacked in a semiconductor chip increase. Therefore, the interactions between elements in different layers (e.g., layers in front end of line or back end of line) become more prominent. For example, in-chip stress is a key index for device performance and package integration behavior, and effective in-chip stress monitoring can provide better process stability and manufacturing assessment in real time.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION OF THE DISCLOSURE

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Conventionally, under the condition where the semiconductor chip does not possess a particular structure for in-chip stress monitoring, when the in-chip stress excesses a threshold value, several crucial portions of the semiconductor structure can be damaged, and hence harming the production yield. Usually the concentrated stress occurs at the level about or over the metallization structure 220, where a plurality of metal lines run parallel, and the stress level may exceed the aforesaid threshold value, depending on the local material composition. Cracks may propagate from the point of stress concentration (e.g., at the level about or over the metallization structure 220), along the metallization structure 220, and toward the substrate 200, where a plurality of active structures reside.

To establish an in-chip stress monitoring structure in a semiconductor chip, in the present disclosure, a semiconductor stress monitoring structure including a stress enhancement structure at the metal redistribution layer, a sensing structure disposed in, partially embedded, or in the vicinity to the substrate, and a metallization structure connecting the stress enhancement structure to the sensing structure.

Figure 1:
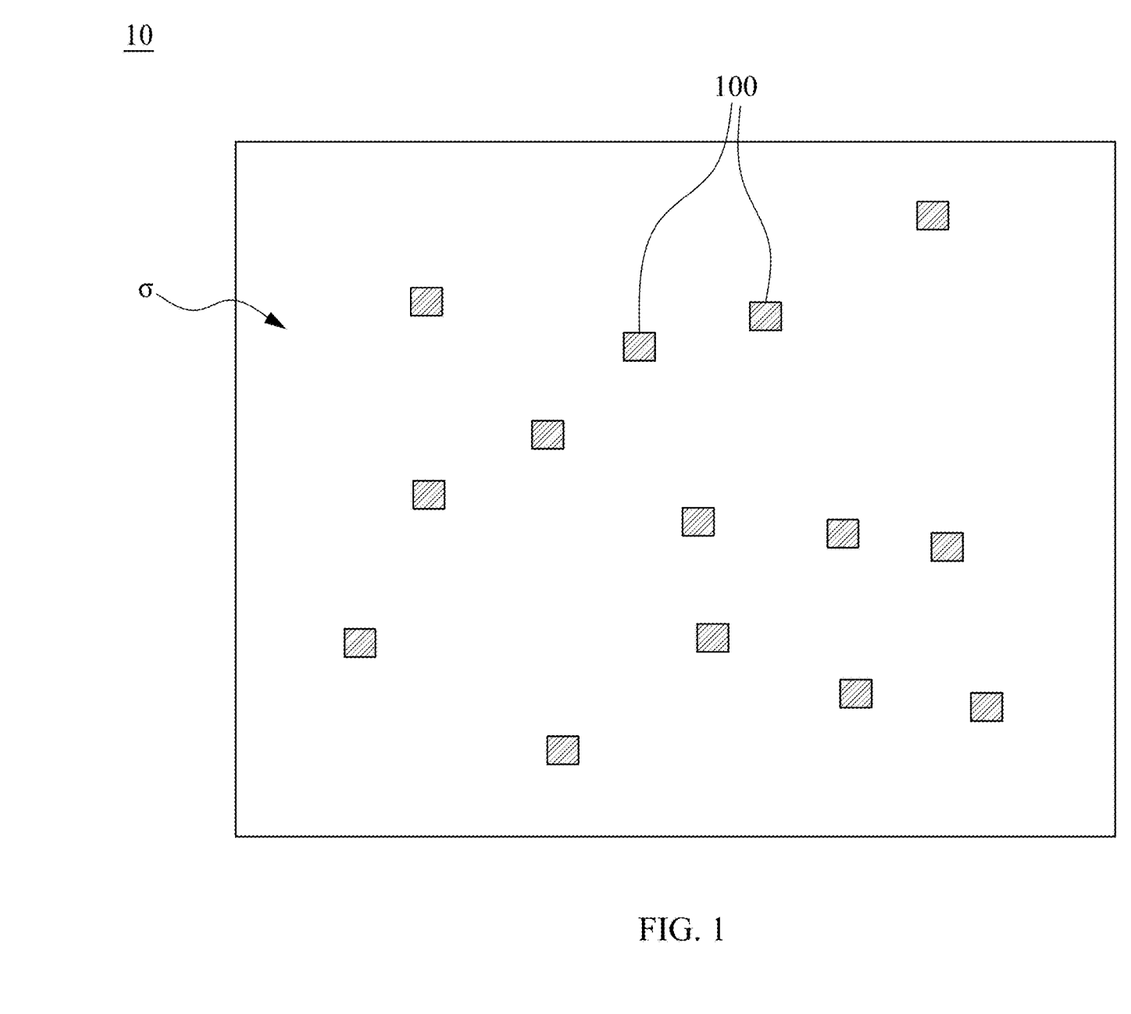
FIG. 1 is a top view of a semiconductor chip, in accordance with some embodiments of the present disclosure.

Reference is made to FIG. 1. FIG. 1 is a top view of a semiconductor chip 10, in accordance with some embodiments of the present disclosure. The semiconductor chip 10 has an in-chip stress σ which is induced during or after manufacturing operations. The stress σ may be a tensile stress, a compressive stress, or a shear stress. The semiconductor chip 10 includes a plurality of semiconductor stress monitoring structures 100 located at dummy regions of the semiconductor chip 10, for example, on a scribe line or in-between active regions. Each of the semiconductor stress monitoring structure 100 is configured to sense the stress σ approximate to its location and generate a collective mapping of the local stress σ on the semiconductor chip 10.

In some embodiments, the semiconductor stress monitoring structures 100 can be substantially identical. The semiconductor stress monitoring structures 100 can be uniformly or non-uniformly distributed on the semiconductor chip 10. In other words, the semiconductor stress monitoring structures 100 are configured to sense the stress σ at different locations on the semiconductor chip 10 in which the locations can be approximate to stress-sensitive structure in the active regions (e.g., an integrated circuit region) of the semiconductor chip 10. In some embodiments, the semiconductor stress monitoring structures 100 are electrically disconnected from each other, and may also be electrically disconnected to other structures in the active region. Therefore, each of the semiconductor stress monitoring structure 100 is able to generate independent monitoring signal indicating the stress σ at corresponding locations without interference.

Figure 2:
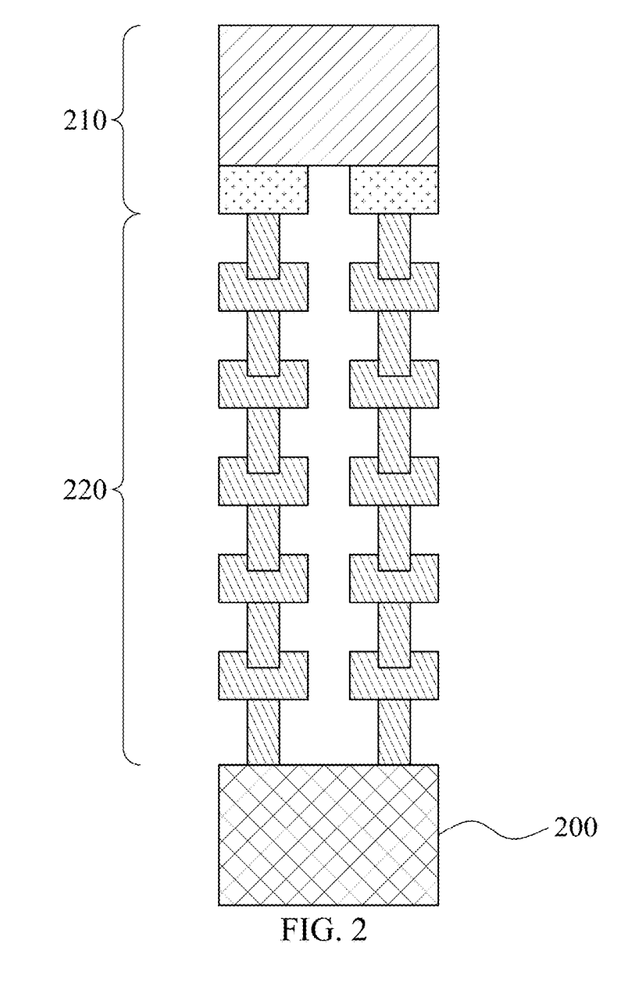
FIG. 2 is a cross sectional view of a semiconductor stress monitoring structure, in accordance with some embodiments of the present disclosure.
Figure 3:
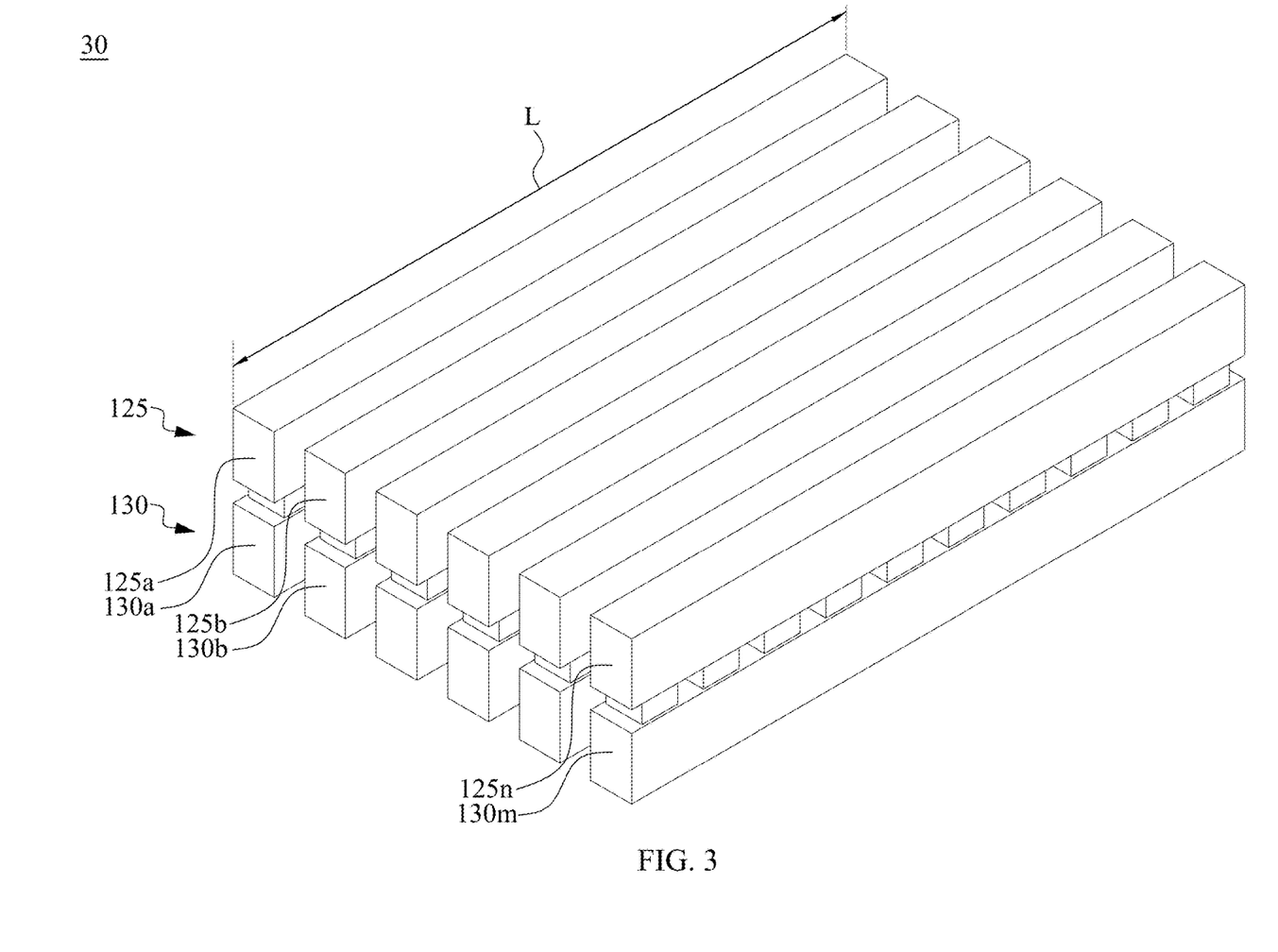
FIG. 3 is a perspective view of a stress enhancement structure, in accordance with some embodiments of the present disclosure.
Figure 4:
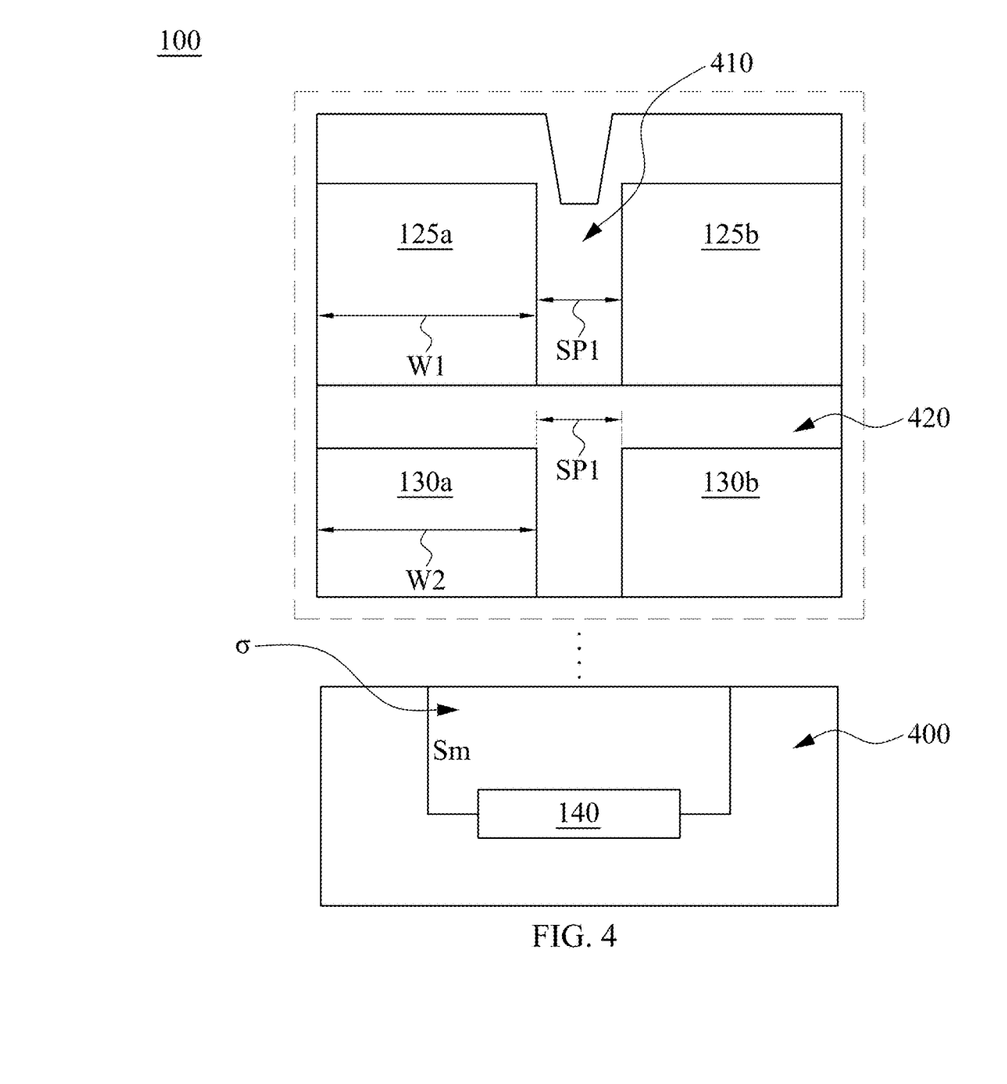
FIG. 4 is a cross sectional view of a semiconductor stress monitoring structure, in accordance with some embodiments of the present disclosure.

Reference is made to FIG. 2. FIG. 2 is a cross sectional view of a semiconductor stress monitoring structure, in accordance with some embodiments of the present disclosure. The semiconductor stress monitoring structure extends from a substrate 200 of the semiconductor chip 10 to a metal redistribution layer 210 through a metallization structure 220. A stress enhancement structure 30 shown in FIG. 3 is disposed at the metal redistribution layer 210. A sensing structure 140 as shown in FIG. 4 is disposed in, partially embedded, or in the vicinity to the substrate 200. In some embodiments, the metallization structure 220 includes conductive lines and conductive vias at different metallization layers over an active region in the substrate 200.

The stress enhancement structure 30 of FIG. 3 is configured to enhance the structural stress at selected locations of the chip so that the stress may be easily detected by the underlying sensing structure 140, as shown in FIG. 4. The sensing structure 140 is configured to generate a monitoring signal in response to the stress σ caused by the stress enhancement structure 30. The monitoring signal can be detected through probing external connections at the vicinity of the metal redistribution layer 210. In some embodiments, the monitoring signal is transmitted to the external connections through the metallization structure 220.

Reference is made to FIG. 3. FIG. 3 is a perspective view of a stress enhancement structure 30, in accordance with some embodiments of the present disclosure. The stress enhancement structure 30 includes conductive segments parallel arranged over the metallization structure 220 of the semiconductor chip 10. More specifically, the parallel conductive segments are arranged at a first layer 125 and a second layer 130 of two adjacent levels. In some embodiments, the first layer 125 and the second layer 130 are collectively called a metal redistribution layer 210, as previously described in FIG. 2. In some embodiments, the first layer 125 can be an aluminum pad layer, and the second layer 130 can be an ultra-thick meal layer composed of copper.

The first layer 125 includes conductive segments 125a, 125b~125n. It should be appreciated that a number of the conductive segments of the stress enhancement structure 30 in the first layer 125 is provided for illustrative purposes and not intended to be limiting. In some embodiments, the first layer 125 includes aluminum, and the conductive segments 125a to 125n include elongated aluminum pads, each having a primary dimension parallel to each other.

The second layer 130 includes conductive segments 130a, 130b~130m. It should be appreciated that a number of the conductive segment of the stress enhancement structure 30 in the second layer 130 is provided for illustrative purposes and not intended to be limiting. In some embodiments, the number of conductive segments in the second layer 130 can be identical or different from the number of conductive segments in the first layer 125. In some embodiments, the conductive segments 130a to 130m include elongated copper lines, each having a primary dimension parallel to each other. In some embodiments, the second layer can be ultra-thick metal lines composed of copper or other suitable materials.

In some embodiments, the primary dimension of the conductive segments in the first layer 125 is aligned with the primary dimension of the conductive segments in the second layer 130. In some embodiments, the number of conductive segments in the first layer 125 and/or the number of conductive segments in the second layer 130 can be greater than 10, and the conductive segments 125a to 125n and 130a to 130m may each have a length L which is equal to or less than 50 μm.

Reference is made to FIG. 4. FIG. 4 is a cross sectional view of the semiconductor stress monitoring structure 100, in accordance with some embodiments of the present disclosure. For the purpose of clarity, the metallization structure 220, as portrayed in FIG. 2, is omitted in FIG. 4.

In FIG. 4, the conductive segments 125a and 125b are substantially vertically aligned with the conductive segments 130a and 130b, respectively. An isolation material 410 and an isolation material 420 are filled between the conductive segments 125a/125b and 130a/130b in the first layer 125 and the second layer 130, respectively. The isolation material 410 and 420 may include, but not limited to, low-k dielectric, undoped silicate glass (USG), borophosphosilicate glass (BPSG), or the like. The sensing structure 140 may be electrically coupled to at least one active device or one passive device in the semiconductor stress monitoring structure 100. For example, the sensing structure 140 can be disposed in the substrate 400, partially embedded in the substrate 400, or at the vicinity of the substrate 400.

In some embodiments, the sensing structure 140 is arranged under a projection of the stress enhancement structure 30. Although not illustrated in FIG. 4, in some embodiments, the sensing structure 140 is arranged under a center of the projection of the conductive segments 125a~125n.

In some embodiments, the sensing structure 140 has two conductive terminals coupled to the overlying stress enhancement structure 30. Specifically, the two conductive terminals of the sensing structure 140 are electrically coupled to any two of the conductive segments 125a to 125n and/or 130a to 130m through the metallization structure 220 of FIG. 2 (omitted in FIG. 4).

In some embodiments, the conductive segments 125a~125n each having a same width W1, and the conductive segments 130a~130m each having a same width W2. For example, the width W1 can be in a range of from about 2 µm to about 35 µm. The width W2 can be in a range of from about 2 µm to about 12 µm.

In some embodiments, a distance SP1 between any two of the adjacent conductive segments 125a~125n is substantially identical, and a distance SP2 between any two of the adjacent conductive segments 130a~130m is substantially identical. The distance SP1 is at least greater than about 2 µm, for example, ranging from about 2 µm to about 35 µm. The distance SP2 is at least greater than about 1 µm, for example, ranging from about 1 µm to about 3 µm.

The stress enhancement structure 30 of FIG. 4 is portrayed for illustrative purposes and may not reflect the exact number of the conductive segments and relative dimension between conductive segments and the sensing structure 140. Arrangement of the stress enhancement structure 30 is crucial because when the stress enhancement structure 30 generates too large the stress exceeding threshold value that the semiconductor chip could mechanically bear, cracks or voids may be generated in the chip and rendering the chip dysfunction. Controlling the stress to be generated by the stress enhancement structure 30 in the semiconductor chip without causing structural defect to the extent substantially affecting the normal function of the electronic devices in the active region has to be considered. Various configurations of the stress enhancement structure 30 are within the contemplated scope of the present disclosure. For example, in various embodiments, the conductive segments 125a~125n are free from vertically aligned with the conductive segments 130a~130m, as described in FIG. 5 and FIG. 7 below.

Figure 5:
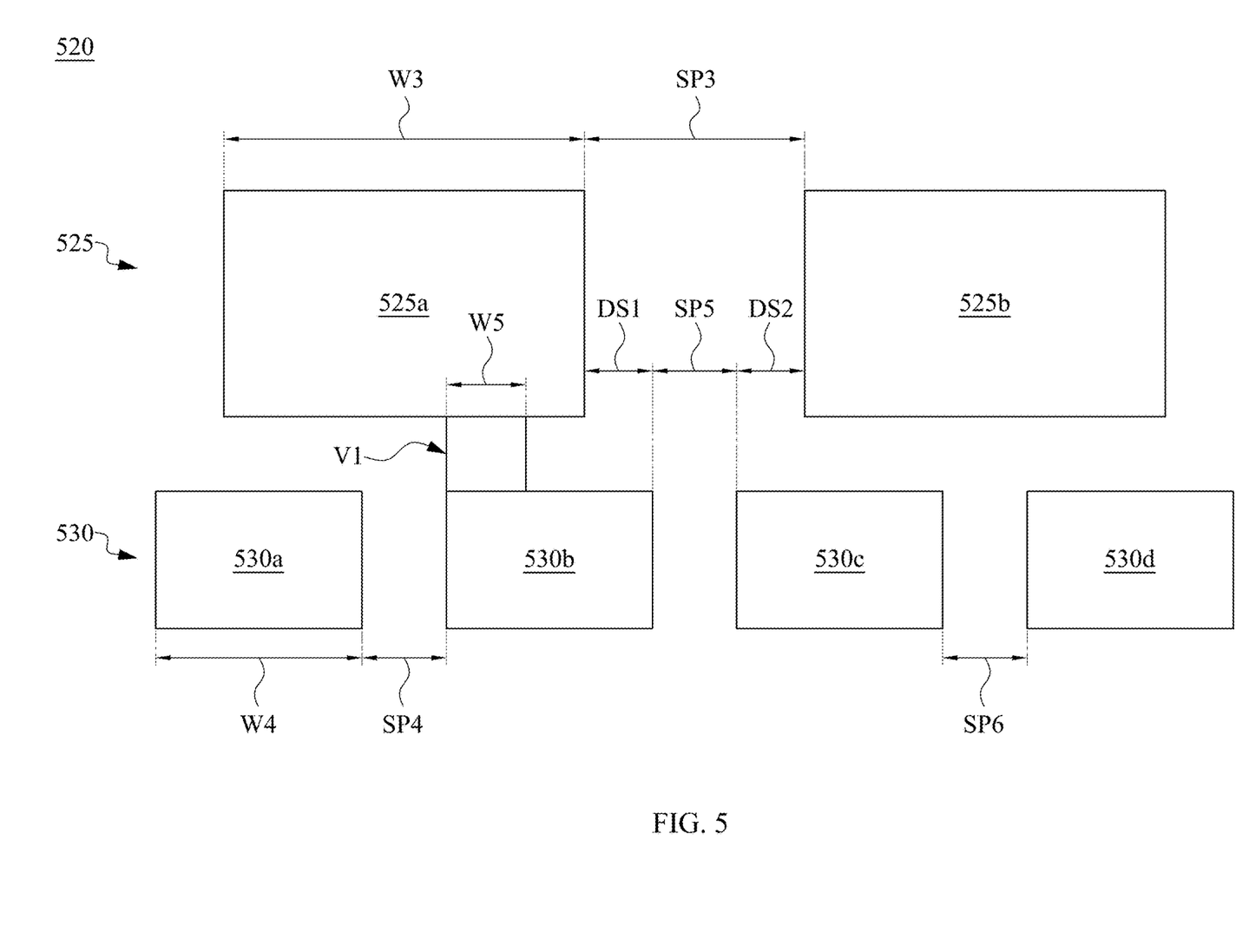
FIG. 5 is a schematic illustration of a stress enhancement structure, in accordance with other embodiments of the present disclosure.

Reference is made to FIG. 5. FIG. 5 is a schematic illustration of a stress enhancement structure 520, in accordance with other embodiments of the present disclosure. Similar to the stress enhancement structure 30, the stress enhancement structure 520 includes conductive segments 525a and 525b arranged in a first layer 525, and conductive segments 530a, 530b, 530c, and 530d arranged in a second layer 530.

In some embodiments, the design rules of the first layer 525 and the second layer 530 are different due to different materials used therein. Therefore, a width W3 of each of the conductive segments 525a and 525b is different from a width W4 of each of the conductive segments 530a~530d. A distance SP3 between the conductive segments 525a and 525b may be different from the distance SP4, SP5, and SP6 between any two of the adjacent conductive segments 530a~530d as illustrated in FIG. 5.

In FIG. 5, the width W3 is greater than the width W4. In some embodiments, the width W3 is in a range of from about 2 µm to about 35 µm, the width W4 is in a range of from about 2 µm to about 35 µm, the distance SP3 is in a range of from about 2 µm to about 35 µm, and the distance SP4, SP5, SP6 are in a range of from about 1 µm to about 3 µm. For example, in an embodiment, the width W3 is about 6 µm, the width W4 is about 3 µm, the distance SP3 is about 4 µm, and the distance SP4, SP5, and SP6 can each be about 2 µm.

In some embodiments, the distance SP4 is substantially the same as the distance SP6, and is different from the distance SP5. For example, in an embodiment, the width W3 is about 6 µm, the width W4 is about 3 µm, the distance SP3 is about 4 µm, the distance SP4 and the distance SP6 are about 1 µm, and the distance SP5 is about 3 µm.

In FIG. 5, the stress enhancement structure 520 further includes a via V1 coupling the first layer 525 to the second layer 530. More specifically, the via V1 electrically couples the conductive segment 525a to the conductive segment 530b. A width W5 of the via V1 is no greater than the width W4 of the conductive segment 530b. In some embodiments, the width W5 is no greater than about 3 µm.

Figure 6:
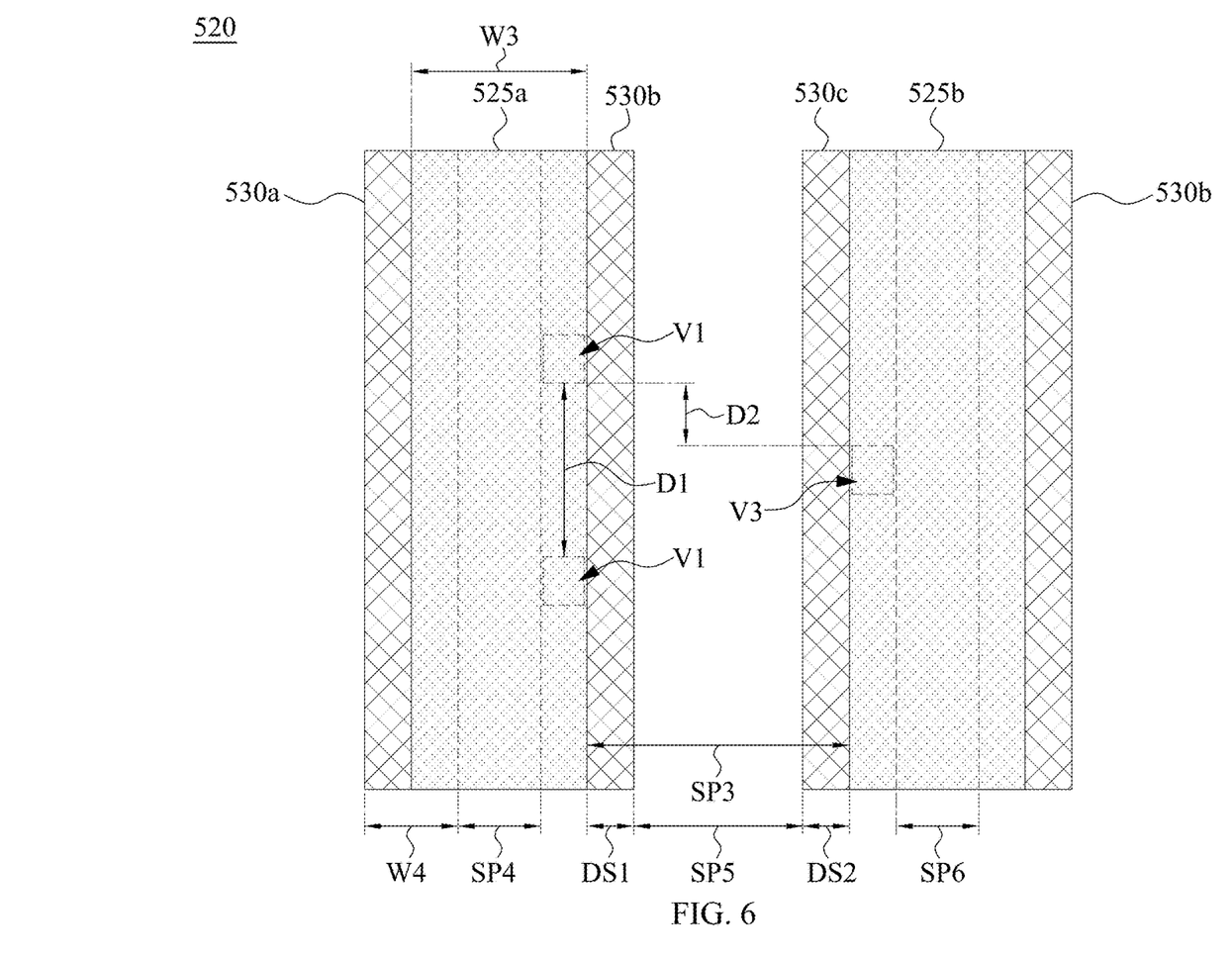
FIG. 6 is a top view of a stress enhancement structure, in accordance with some embodiments of the present disclosure.

The via V1 is configured to transmit the monitoring signal Sm (annotated in FIG. 4) from the vicinity of the sensing structure 140 toward the external connections at the vicinity of the metal redistribution layer 210. It should be appreciated that only one via V1 in the FIG. 5 is provided for illustrated purposes and not intended to be limiting. The stress enhancement structure includes more vias V2 and V3, as illustrated in FIG. 6, can be implemented in some embodiments. FIG. 6 is a top view of the stress enhancement structure 520, according to some embodiments of the present disclosure. The identical numerals shown in FIG. 5 and FIG. 6 refer to the same elements or their equivalents. In some embodiments, the stress enhancement structure 520 further includes a via V2 coupling the conductive segment 525a and the conductive 530b. In some embodiments, the via V2 is separated from the via V1 by a distance D1 about more than 20 µm. In some embodiments, the stress enhancement structure 520 further includes a via V3 coupling the conductive segment 525b and the conductive 530c (not shown in FIG. 5). The via V3 is configured to transmit the monitoring signal Sm from the vicinity of the sensing structure 140 toward the external connections at the vicinity of the metal redistribution layer 210. The via V3 can be separated from the via V1 by a distance D2 about more than 10 µm.

Referring back to FIG. 5, a distance DS1 and a distance DS2 are associated with the alignment of the conductive segments 525a~525b and the conductive segments 530a~530d, in which the distance DS1 indicates a distance between a lateral edge of the conductive segments 525a and a lateral edge of the conductive segment 530b, and the distance DS2 indicates a distance between a lateral edge of the conductive segments 525b and a lateral edge of the conductive segment 530c as shown in FIG. 5. Alternatively, the distance SP3 is equal to a sum of the distance DS1, the distance DS2, and the distance SP5. In some embodiments, the distance DS1 is substantially equal to the distance DS2. For example, the distance SP3 is about 4 µm, the distance SP5 is about 3 µm, the distance DS1 is about 0.5 µm, and the distance DS2 is about 0.5 µm.

In other embodiments, the conductive segments 525a and 525b can be shifted left-ward or right-ward as a whole, so as to make the distance DS1 different from the distance DS2. The distance DS1 can be in a range of from about 0 µm to about 1 µm, and the distance DS2 can be in a range of from about 1 µm to about 0 µm.

Figure 7:
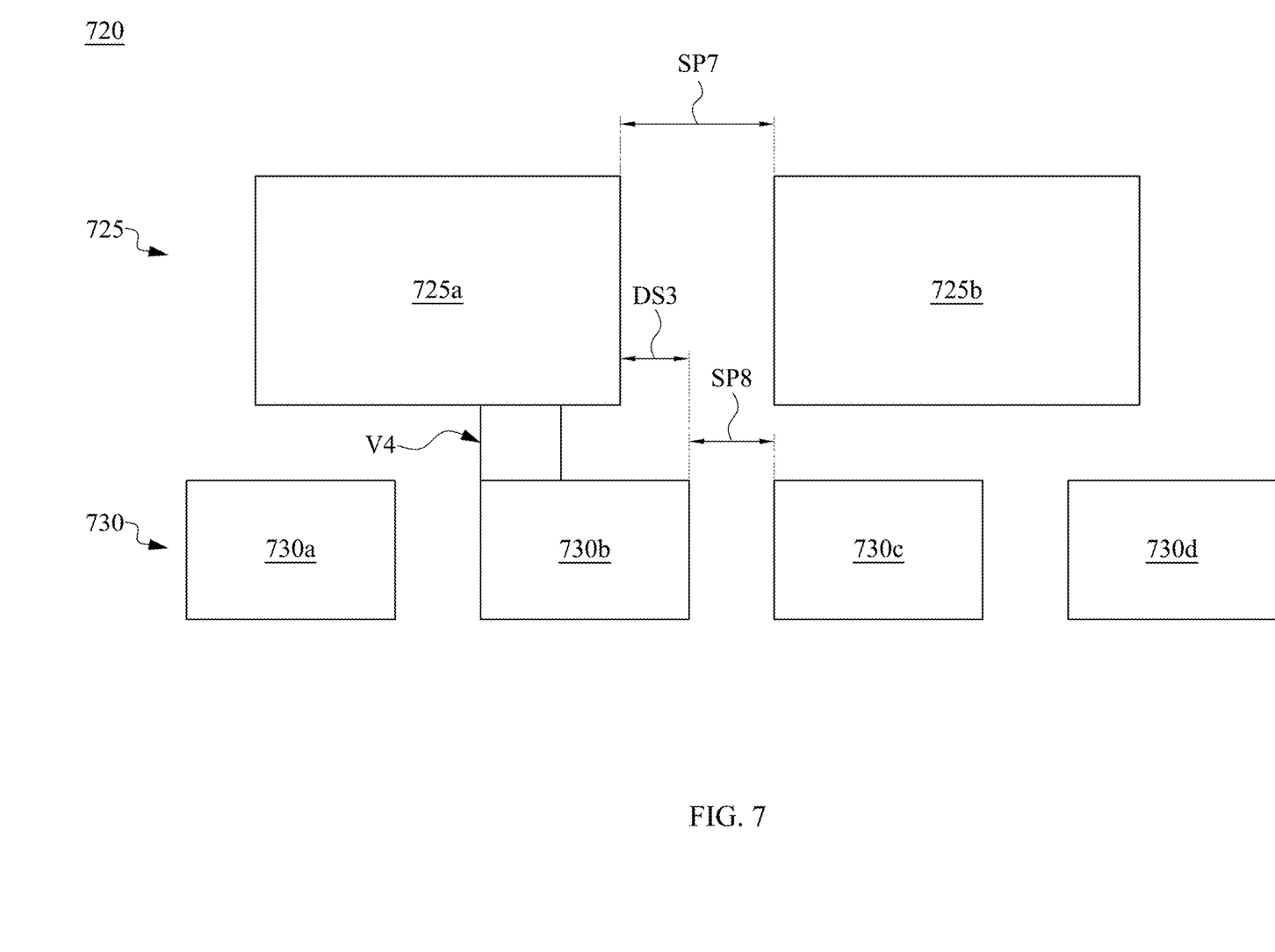
FIG. 7 is a schematic illustration of a stress enhancement structure, in accordance with various embodiments of the present disclosure.

In various embodiments, the distance DS2 is substantially equal 0 as illustrated in FIG. 7. FIG. 7 is a schematic diagram of a stress enhancement structure 720, in accordance with various embodiments of the present disclosure. Similar to the stress enhancement structures 30 and 520, the stress enhancement structure 720 includes conductive segments 725a and 725b arranged in a first layer 725, conductive segments 730a, 730b, 730c, and 730d arranged in a second layer 730, and a via V4 coupling the conductive segment 725a and the conductive segment 730b.

In FIG. 7, a distance SP7 between the conductive segment 725a and the conductive segment 725b is equal to a sum of a distance DS3 and a distance SP8, in which the distance DS3 indicates a distance between a lateral edge of the conductive segment 725a and a lateral edge of the conductive segment 730b, and the distance SP8 indicates a distance between the conductive segments 730b and 730c. A lateral edge of the conductive segment 725b is substantially aligned with a lateral edge of the conductive segment 730c. For example, the distance SP7 is about 4 μm, the distance DS3 is about 1 μm, and the distance SP8 is about 3 μm.

The number of conductive segments in the stress enhancement structures 520 and 720 are provided for illustrative purposes and not intended to be limiting. It should be appreciated that the stress enhancement structures 520 and 720 can include more conductive segments arranged in the first layer 525, 725 and the second layer 530, 730. For example, the stress enhancement structure 520 further includes conductive segments 525c~525n parallel arranged in the first layer 525 and conductive segments 530e~530m parallel arranged in the second layer 530. Each of the conductive segments 525c~525n has a width equal to the width W3. Each of the conductive segments 530e~530m has a width equal to the width W4. The distance between the adjacent conductive segments 525c~525n is equal to the distance SP3. The distance between the adjacent conductive segments 530e~530m is equal to the distance SP4, SP5, or SP6.

As described above, the sensing structure 140 in the semiconductor stress monitoring structure 100 is configured to generate the monitoring signal Sm in response to the stress σ caused by the stress enhancement structures 30, 520, and/or 720. In some embodiments, the sensing structure 140 is a stress sensitive element which is able to perform different characteristics responding to the stress.

Figure 8:
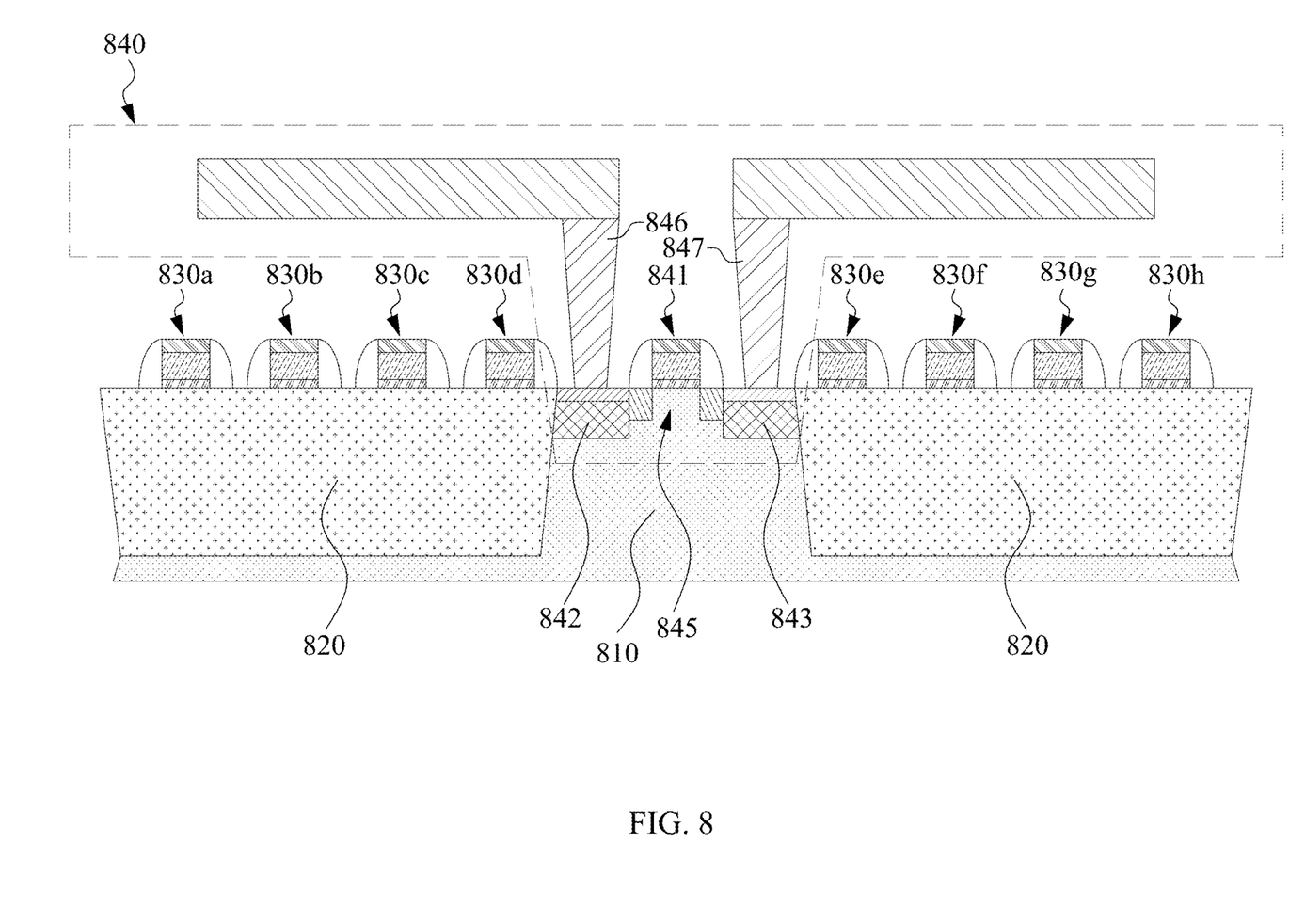
FIG. 8 is a cross sectional view of a sensing structure, in accordance with some embodiments of the present disclosure.
Figure 9:
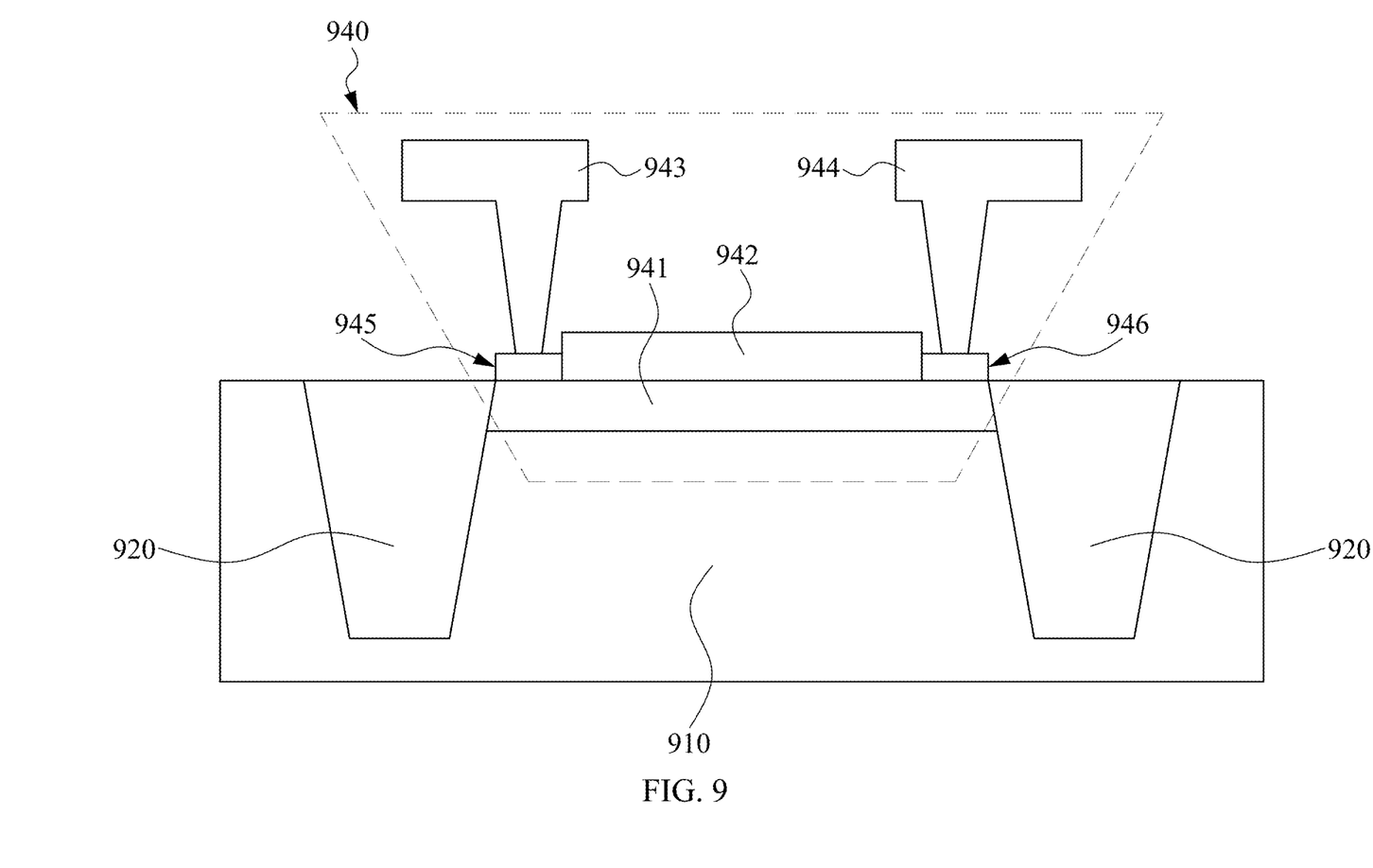
FIG. 9 is a cross sectional view of a sensing structure, in accordance with other embodiments of the present disclosure.
Figure 10:
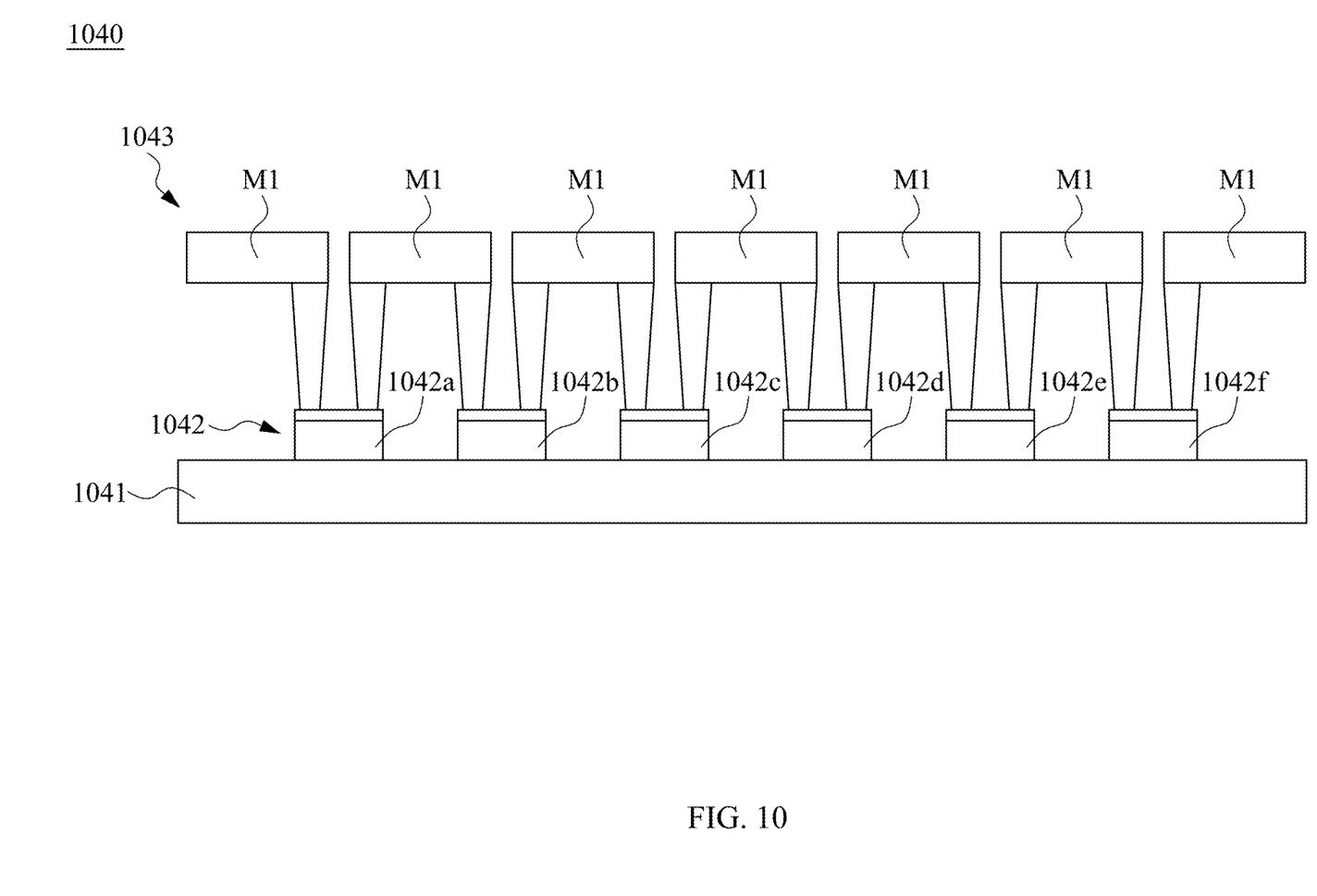
FIG. 10 is a cross sectional view of a sensing structure, in accordance with various embodiments of the present disclosure.

Reference is made to FIG. 8, FIG. 9, and FIG. 10. FIG. 8, FIG. 9, and FIG. 10 illustrate cross sectional views of sensing structures 840, 940, and 1040, respectively, in accordance with various embodiments of the present disclosure. In some embodiments, the sensing structure 140 portrayed in FIG. 4 can be implemented as the sensing structures 840, 940, and/or 1040. However, the present disclosure is not intended to be limiting.

In some embodiments, in FIG. 8, the sensing structure 840 includes a transistor disposed in, partially embedded in, or at the vicinity to the substrate. The transistor is configured to respond the stress σ caused by the stress enhancement structure previously described and generate the monitoring signal Sm. The transistor includes a gate 841, a first source/drain (S/D) region 842, a second S/D region 843, a channel region 845, a first contact feature 846, and a second contact feature 847. The gate 841 is disposed over the channel region 845. The first S/D region 842 and the second S/D region 843 are abutted at two opposite sides of the channel region 845. The first contact feature 846 and the second contact feature 847 are in contact with the first S/D region 842 and the second S/D region 843, respectively.

The first contact feature 846 and the second contact feature 847 are electrically coupled to the stress enhancement structures 30, 520, and/or 720 through the metallization structure 220 of FIG. 2. In some embodiments, although not illustrated, the gate 841 may be electrically coupled to the stress enhancement structures 30, 520, and/or 720 for receiving a control signal.

In some embodiments, when the transistor experiences a changed state of stress σ, a saturation current of the transistor 840 varies. For example, the control signal is provided to the gate 841, and a S/D voltage is applied crossing the first S/D region 842 and the second S/D region 843, in which the control voltage and the S/D voltage have sufficient potential levels to make the transistor 840 operated at the saturation mode. When the state of stress σ varies, the saturation current generated by the transistor varies. Thus, the saturation current changes in accordance with the stress σ and the change of current serve as the monitoring signal Sm to be detected, for example, at the external connections situated at the vicinity of the metal redistribution layer 210, as previously described in FIG. 2.

In some embodiments, the substrate includes a well region 810, an STI 820, and optionally dummy gates 830a~830h. The transistor is disposed above the well region 810 and surrounded by the STI 820. The dummy gates 830a~830h have the same configuration as the gate 841 and are arranged parallel to each other. As previously described, the sensing structure 840 is electrically isolated from other active or passive elements in the active regions of the semiconductor chip 10 to prevent signal interference and for the sake of obtaining sensing result at specific locations.

In some embodiments, in FIG. 9, the sensing structure 940 is a resistor disposed in, partially embedded in, or at the vicinity to the substrate. The resistor is configured to respond the stress σ caused by the stress enhancement structure previously describe and generate the monitoring signal Sm. The resistor includes an implantation region 941, a dielectric slab 942, a first contact feature 943, a second contact feature 944, a metal pad 945, and a metal pad 946. The dielectric slab 942 is disposed above the implantation region 941. The first contact feature 943 is coupled to one side of the implantation region 941 through the metal pad 945. The second contact feature 944 is coupled to the opposite side of the implantation region 941 through the metal pad 946. The dielectric slab 942 is configured to isolate the first contact feature 943 and the second contact feature 944. The metal pads 945 and 946 are configured to improve the contact profile between the contact features 943, 944 and implantation region 941. In some embodiments, the metal pads 945 and 946 include tungsten.

The first contact feature 943 and the second contact feature 944 are electrically coupled to the stress enhancement structures 30, 520, and/or 720 through the metallization structure 220 of FIG. 2. The implantation region 941 is composed of stress sensitive material. When the implantation region 941 experiences a changed state of stress σ, the resistance of the implantation region 941 varies. For example, a voltage is applied crossing the first contact feature 943 and the second contact feature 944. When the resistor experiences a changed state of stress σ, a current passing through the resistor can be designed to decrease or increase. Thus, the change of current in accordance with the stress σ serve as the monitoring signal Sm to be detected, for example, at the external connections situated at the vicinity of the metal redistribution layer 210, as previously described in FIG. 2.

In some embodiments, the substrate includes a semiconductor region 910 and a STI 920. The resistor is disposed on the semiconductor region 910 and abutted the STI 920. In some embodiments, the semiconductor region 910 possesses a lower carrier concentration than the implantation region 941.

In an alternative embodiment, a polysilicon region can replace the implantation region 941 in the resistor. In such embodiments, the polysilicon region serves as a stress sensitive body. When the resistor experiences changed state of stress σ, the resistance of the polysilicon 941 varies.

In some embodiments, in FIG. 10, the sensing structure 1040 includes a plurality of transistors. The transistors are configured to respond the stress σ caused by the stress enhancement structure previously describe and generate the monitoring signal Sm. The sensing structure 1040 includes an oxide region 1041, a polysilicon array 1042, and a connection feature 1043. The polysilicon array 1042 is disposed above the oxide region 1041. In some embodiments, the polysilicon array 1042 serves as the gates in the plurality of transistors. The polysilicon array 1042 includes polysilicon features 1042a~1042f, and the polysilicon features 1042a~1042f are connected by the connection feature 1043 in series.

The connection feature 1043, for example, the first level metal layer, is electrically coupled to the stress enhancement structures 30, 520, and/or 720 through the metallization structure 220. The polysilicon features 1042a~1042f are composed of stress sensitive materials. When the polysilicon array 1042 experiences changed state of stress σ, the resistances of the polysilicon features 1042a~1042f vary. With a constant voltage crossing the connection feature 1043, when the sensing structure 1040 experiences a changed state of stress σ, the resistances of the polysilicon features 1042a~1042f can be designed to increase or decrease, a current passing through the connection feature 1043 and the polysilicon array 1042 changes accordingly. Thus, the change of current in accordance with the stress σ serve as the monitoring signal Sm to be detected, for example, at the external connections situated at the vicinity of the metal redistribution layer 210, as previously described in FIG. 2.

It should be appreciated that the sensing structures 840, 940, and 1040 are provided for the illustrated purposes and not intended to be limiting. In various embodiments, the sensing structure can be other active or passive devices such as a capacitor, which the capacitance varies corresponding to the stress σ.

Figure 11:
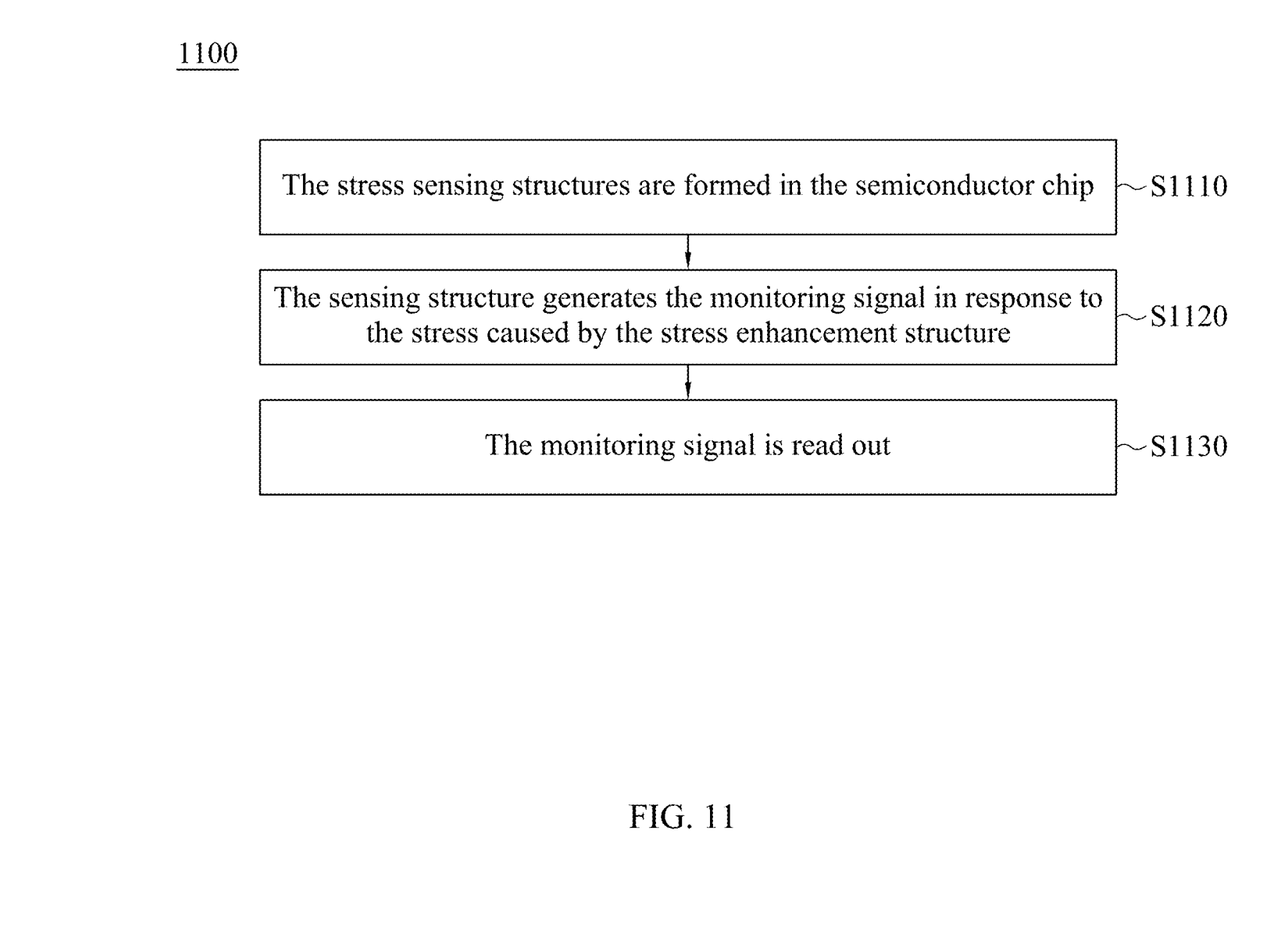
FIG. 11 is a flowchart of a method for monitoring the stress in a semiconductor monitoring structure, in accordance with some embodiments of the present disclosure.

Reference is made to FIG. 11. FIG. 11 is a flowchart showing a method 1100 for monitoring the stress σ in the semiconductor chip 10, in accordance with some embodiments of the present disclosure. The method 1100 includes operations S1110. S1120, and S1130.

In operation S1110, the semiconductor stress monitoring structures 100 are formed in the semiconductor chip 10.

In operation S1120, the sensing structure generates the monitoring signal Sm in response to the stress σ caused by the stress enhancement structure. The sensing structure can be the sensing structure 140, 840, 940, and/or 1040 described above, and the stress enhancement structure can be the stress enhancement structure 30, 520, and/or 720 described above.

In operation S1130, the monitoring signal Sm is read out. In some embodiments, the monitoring signal Sm is read by an electronic device. The electronic device may include a processor and an input/out (I/O) module.

Some embodiments provide a semiconductor stress monitoring structure, including a substrate, a plurality of first conductive segments, a plurality of second conductive segments, and a sensing structure. The first conductive segments are over the substrate and arranged parallel to each other. The second conductive segments are arranged below the first conductive segments and parallel to each other. The sensing structure is proximate to the substrate. The sensing structure is configured to respond to a stress caused by the first conductive segments and the second conductive segments and generate a monitoring signal.

Some embodiments provide a semiconductor chip, including a plurality of stress sensing structures. Each of the sensing structure includes a stress enhancement structure and a sensing structure. The stress enhancement structure is over a metallization of the semiconductor chip. The sensing structure is under the metallization of the semiconductor chip and configured to generate a monitoring signal in response to a stress caused by the stress enhancement structure. The adjacent stress sensing structures are electrically disconnected.

Some embodiments provide a semiconductor stress monitoring structure, including a stress enhancement structure and a sensing structure. The stress enhancement structure includes a plurality of conductive segments arranged parallel to each other. The sensing structure is under a projection of the conductive segments and configured to generate a monitoring signal in response to a stress caused by the conductive segments.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor stress monitoring structure, comprising:
   a substrate;
   a plurality of first conductive segments over the substrate, arranged parallel to each other;
   a plurality of second conductive segments arranged below the plurality of first conductive segments and parallel to each other;
   a sensing structure proximate to the substrate, configured to respond to a stress caused by the first conductive segments and the second conductive segments and generate a monitoring signal, and
   a plurality of interconnection layers arranged between the sensing structure and the plurality of second conductive segments, wherein the plurality of interconnection layers are configured to transmit the monitoring signal from the sensing structure to one of the first conductive segments or the second conductive segments.

2. The structure of claim 1, wherein the plurality of first conductive segments and the plurality of second conductive segments extend in the same direction.

3. The structure of claim 1, wherein a first distance between two of the plurality of first conductive segments is in a range of from about 2 μm to about 35 μm.

4. The structure of claim 1, wherein a second distance between two of the plurality of second conductive segments is in a range from about 1 μm to about 3 μm.

5. The structure of claim 1, wherein the plurality of first conductive segments comprises aluminum pads and the plurality of second conductive segments comprise copper lines.

6. The structure of claim 1, wherein the sensing structure comprises a transistor, a capacitor, a resistor, or the combinations thereof.

7. A semiconductor chip, comprising:
a plurality of semiconductor stress sensing structures, each of the semiconductor sensing structure comprising:
a stress enhancement structure over a metallization of the semiconductor chip; and
a sensing structure under the metallization of the semiconductor chip, configured to generate a monitoring signal in response to a stress caused by the stress enhancement structure,
wherein adjacent stress sensing structures are electrically disconnected.

8. The semiconductor chip of claim 7, wherein the stress enhancement structure comprises:
a plurality of first conductive segments arranged parallel to each other; and
a plurality of second conductive segments, arranged below the plurality of first conductive segments and parallel to each other, and the first conductive segments extend in a same direction to the second conductive segments.

9. The semiconductor chip of claim 8, wherein one of the second conductive segments is under a projection of one of the first conductive segments.

10. The semiconductor chip of claim 9, wherein a distance between adjacent first conductive segments is greater than a distance between adjacent second conductive segments.

11. The semiconductor chip of claim 10, wherein the distance between adjacent first conductive segments is in a range of from about 2 μm to about 35 μm.

12. The semiconductor chip of claim 8, wherein the stress enhancement structure further comprises a via coupling one of the first conductive segments to one of the second conductive segments.

13. The semiconductor chip of claim 8, wherein the first conductive segments comprises aluminum pads.

14. The semiconductor chip of claim 13, wherein the second conductive segments comprises ultra-thick copper metal lines.

15. The semiconductor chip of claim 7, wherein the sensing structure comprises a transistor, a capacitor, a resistor, or the combinations thereof.

16. The semiconductor chip of claim 7, wherein the plurality of the sensing structures are distributed on the semiconductor chip.

17. A semiconductor stress monitoring structure, comprising:
a stress enhancement structure comprising a plurality of conductive segments arranged parallel to each other; and
a sensing structure under a projection of the conductive segments, configured to generate a monitoring signal in response to a stress caused by the conductive segments,
wherein the conductive segments comprises a plurality of first conductive segments arranged at a first layer, and the first conductive segments comprises aluminum pads.

18. The structure of claim 17, wherein the conductive segments further comprises a plurality of second conductive segments arranged at a second layer, wherein the second conductive segments comprises ultra-thick copper metal lines.

19. The structure of claim 18, wherein a first distance between two of the plurality of first conductive segments is in a range of from about 2 μm to about 35 μm, and a second distance between two of the plurality of second conductive segments is in a range from about 1 μm to about 3 μm.

20. The structure of claim 17, wherein the sensing structure comprises a plurality of sensors, wherein the sensors are arranged as an array under a projection of the stress enhancement structure.

* * * * *